United States Patent
Hsiao et al.

(10) Patent No.: US 10,510,527 B2
(45) Date of Patent: Dec. 17, 2019

(54) SINGLE WAFER CLEANING TOOL WITH $H_2SO_4$ RECYCLING

(71) Applicant: Taiwan Semiconductor Manufacturing Co., Ltd., Hsin-Chu (TW)

(72) Inventors: Chien-Wen Hsiao, Hsinchu (TW); Shao-Yen Ku, Jhubei (TW); Tzu-Yang Chung, Hsinchu (TW); Shang-Yuan Yu, Hsinchu (TW); Wagner Chang, Huwei Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1100 days.

(21) Appl. No.: 13/756,717

(22) Filed: Feb. 1, 2013

(65) Prior Publication Data
US 2014/0216500 A1 Aug. 7, 2014

(51) Int. Cl.
*H01L 21/02* (2006.01)

(52) U.S. Cl.
CPC ............ *H01L 21/02052* (2013.01)

(58) Field of Classification Search
CPC . G03F 7/3092; G03F 7/423; H01L 21/02079; H01L 21/6704; H01L 21/67023;
(Continued)

(56) References Cited

U.S. PATENT DOCUMENTS

| 6,055,995 A * | 5/2000 | Miyazawa | ............... B08B 3/10 134/109 |
|---|---|---|---|
| 2001/0009155 A1 * | 7/2001 | Matsuno | .................. B08B 3/12 134/2 |

(Continued)

FOREIGN PATENT DOCUMENTS

| JP | 2010021215 A | * | 1/2010 |
| JP | 2012080048 A | * | 4/2012 |

OTHER PUBLICATIONS

JP2010021215—Machine Translation, Jan. 2010.*
(Continued)

*Primary Examiner* — Marc Lorenzi
(74) *Attorney, Agent, or Firm* — Eschweiler & Potashnik, LLC (57) ABSTRACT

Some embodiments relate to methods and apparatus for mitigating high metal concentrations in photoresist residue and recycling sulfuric acid ($H_2SO_4$) in single wafer cleaning tools. In some embodiments, a disclosed single wafer cleaning tool has a processing chamber that houses a semiconductor substrate. A high oxidative treatment unit may apply a high oxidative chemical pre-treatment to the semiconductor substrate to remove a photoresist residue having metal impurities from the semiconductor substrate in a manner that results in a contaminant remainder. A SPM cleaning unit apply a sulfuric-peroxide mixture (SPM) cleaning solution to the semiconductor substrate to remove the contaminant remainder from the semiconductor substrate as an SPM effluent. The SPM effluent is provided to a recycling unit configured to recover sulfuric acid ($H_2SO_4$) from the SPM effluent and to provide the recovered $H_2SO_4$ to the SPM cleaning unit via a feedback conduit.

20 Claims, 5 Drawing Sheets

(58) Field of Classification Search
CPC ......... H01L 21/67051; H01L 21/67075; H01L 21/6708
See application file for complete search history.

(56) References Cited

U.S. PATENT DOCUMENTS

| | | | | |
|---|---|---|---|---|
| 2002/0108643 | A1* | 8/2002 | Yasuda | B08B 3/00 |
| | | | | 134/107 |
| 2004/0000322 | A1 | 1/2004 | Verhaverbeke | |
| 2011/0130009 | A1* | 6/2011 | Kumnig | G03F 7/423 |
| | | | | 438/745 |
| 2013/0260569 | A1* | 10/2013 | Ganster | H01L 21/67017 |
| | | | | 438/745 |
| 2014/0144463 | A1* | 5/2014 | Brown | H01L 21/67051 |
| | | | | 134/1.3 |

OTHER PUBLICATIONS

JP2012080048—Machine Translation, Apr. 2012.*
Kurt K. Christenson, et al., "All Wet Stripping of Implanted Photoresist", 2006 UCPSS, p. 1-4.

* cited by examiner

SINGLE WAFER CLEANING TOOL WITH $H_2SO_4$ RECYCLING

BACKGROUND

Semiconductor wafer cleaning is widely used in semiconductor processing. For example, many processes used for integrated chip fabrication (e.g., deposition processes, etching processes, etc.) leave a residue on a semiconductor wafer. If the residue is not removed, it can contaminate devices on the semiconductor wafer leading to failure of integrated chips on the semiconductor wafer.

In recent technology nodes (e.g., 28 nm, 22 nm, etc.), the semiconductor industry has increasingly replaced large batch (i.e., wet bench) cleaning systems with single wafer cleaning tools for removal of contaminant particles from a wafer surface. Single wafer cleaning tools are configured to perform a wet cleaning process of a single semiconductor wafer at a given time. Using a single wafer cleaning tool allows for better process control in wet cleaning processes, thereby improving particle removal efficiency (PRE) and increasing yield.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Photoresist is light sensitive material used in many semiconductor processes. Photoresist provides for a spin-on masking layer that can be selectively patterned using a photolithography process to form intricate patterns on a semiconductor substrate. For example, photoresist layers are often formed to selectively mask an underlying semiconductor substrate from a semiconductor process, such as an implantation or etch. After the semiconductor process has been completed, the photoresist layer is removed from the semiconductor substrate by way of an ashing process. Ashing processes are plasma processes that form a plasma having a monatomic reactive species (e.g., such as oxygen or fluorine), which combines with photoresist to form an ash that is evacuated from a processing chamber.

After an ashing processes has been completed, a photoresist residue comprising metal impurities remains on the semiconductor substrate. Single wafer cleaning tools are able to remove the photoresist residue from the semiconductor substrate with a high particle removal efficiency (PRE) by using a reactive chemistry. For example, single wafer cleaning tools can be configured to perform a wet etch using a SPM cleaning solution, comprising sulfuric acid ($H_2SO_4$) and hydrogen peroxide ($H_2O_2$), to remove the photoresist residue from a semiconductor substrate.

However, single wafer cleaning tools often use a large amount of sulfuric acid in comparison to wet bench tools. The large amount of sulfuric acid result in a large amount of SPM effluent (i.e., waste), which drives a high cost for removal and chemical treatment of the SPM effluent. Furthermore, the metal impurities within the SPM effluent prevent the SPM cleaning solution from being recycled and used again. The high chemical usage and associated large chemical treatment costs are a serious problem in modern day single wafer cleaning tools.

Accordingly, the present disclosure relates to methods and apparatus for mitigating high metal concentrations in photoresist residue and recycling sulfuric acid ($H_2SO_4$) in single wafer cleaning tools. In some embodiments, a disclosed single wafer cleaning tool comprises a processing chamber configured to house a semiconductor substrate having a photoresist residue having metal impurities. A high oxidative treatment unit is configured to apply a high oxidative chemical pre-treatment to the semiconductor substrate to remove the photoresist residue having metal impurities in a manner that results in a contaminant remainder. A SPM cleaning unit is configured to apply a sulfuric-peroxide mixture (SPM) cleaning solution to the semiconductor substrate to remove the contaminant remainder from the semiconductor substrate as an SPM effluent. The SPM effluent is provided to a recycling unit configured to recover sulfuric acid ($H_2SO_4$) from the SPM effluent and to provide the recovered $H_2SO_4$ to the SPM cleaning unit via a feedback conduit. By using the high oxidative chemical treatment to remove the photoresist residue from the semiconductor substrate, SPM effluent from the wet cleaning process has a low concentration of metal impurities and is able to be recycled.

Figure 1:
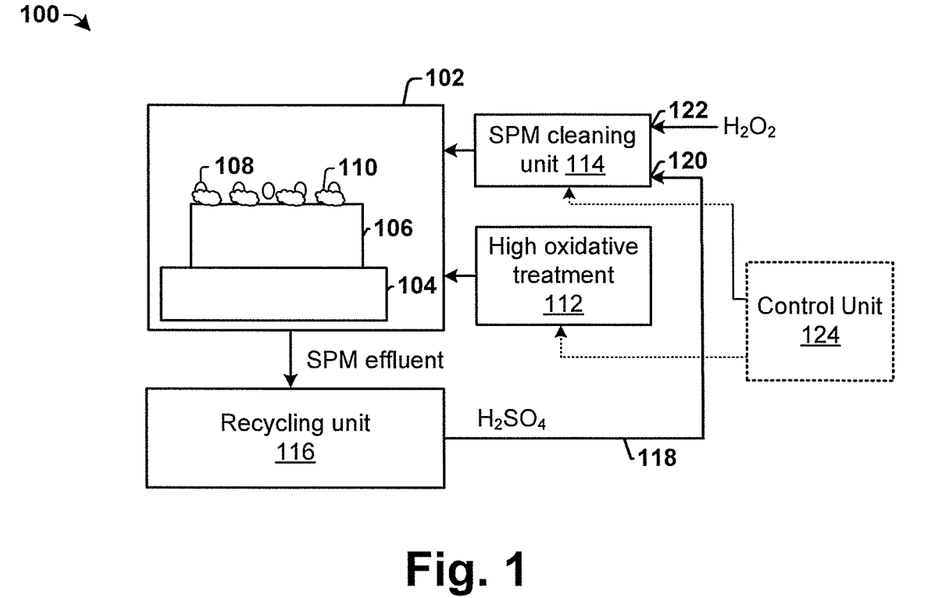
FIG. 1 illustrates a block diagram of some embodiments of a disclosed single wafer cleaning tool.

FIG. 1 illustrates a block diagram of some embodiments of a disclosed single wafer cleaning tool 100.

The single wafer cleaning tool 100 comprises a processing chamber 102 having a wafer chuck 104 configured to hold a semiconductor substrate 106. In some embodiments, the single wafer cleaning tool 100 is configured to receive the semiconductor substrate 106 from a plasma ashing tool. In such embodiments, the semiconductor substrate 106 may comprise a photoresist residue 110 having metal impurities 108 remaining after performing a dry etching process (e.g., a photoresist ashing process).

A high oxidative treatment unit 112 is in communication with the processing chamber 102. The high oxidative treatment unit 112 is configured to apply a high oxidative chemical pre-treatment to the semiconductor substrate 106. The high oxidative chemical pre-treatment removes the photoresist residue 110 and metal impurities 108 from the semiconductor substrate 106 to form a contaminant remainder having a low concentration of metal impurities 108. In some embodiments the high-oxidative chemical pre-treatment may comprise ozone ($O_3$) configured to remove a part of the photoresist residue 110 having metal impurities 108 from the surface of the semiconductor substrate 106.

A SPM cleaning unit 114 is also in communication with the processing chamber 102. The SPM cleaning unit 114 is configured to perform a wet clean process, which removes the contaminant remainder from the semiconductor substrate 106. In some embodiments, the SPM cleaning unit 114 is configured to applying a sulfuric-peroxide mixture (SPM) cleaning solution to the semiconductor substrate 106. The SMP cleaning solution removes remaining photoresist residue, by breaking down the carbon polymer chain to form water ($H_2O$) and carbon dioxide ($CO_2$) by-products, and metal residue. The $CO_2$ by-product evaporates from the semiconductor substrate 106, while the $H_2O$ by product can be washed off of the semiconductor substrate 106 as a SPM effluent also comprising sulfuric acid ($H_2SO_4$).

A recycling unit 116 is configured to receive the SPM effluent from the processing chamber 102. In some embodiments, the recycling unit 116 is configured to remove water ($H_2O$) from the SPM effluent, resulting in a recovered sulfuric acid ($H_2SO_4$) that is provided by way of a feedback conduit 118 to a first inlet 120 of the SPM cleaning unit 114. The SPM cleaning unit 114 is configured to mix the recovered $H_2SO_4$ with hydrogen peroxide ($H_2O_2$) received at a second inlet 122 to generate an SPM cleaning solution, which is subsequently provided to the processing chamber 102 to perform a single wafer cleaning process.

In some embodiments, a control unit 124 is configured to selectively operate the high oxidative treatment unit 112 and the SPM cleaning unit 114. For example, in some embodiments the control unit 124 may operate the high oxidative treatment unit 112 during a first time period and the SPM cleaning unit 114 during a second time period, subsequent to the first time period. In such embodiments, since the high oxidative treatment, performed by the high oxidative treatment unit 112, has removed a large portion of the photoresist residue 110 and metal impurities 108 from the semiconductor substrate 106, SPM effluent from the wet cleaning process performed by the SPM cleaning unit 114 has a low concentration of metal impurities and is able to be recycled by the recycling unit 116.

Figure 2:
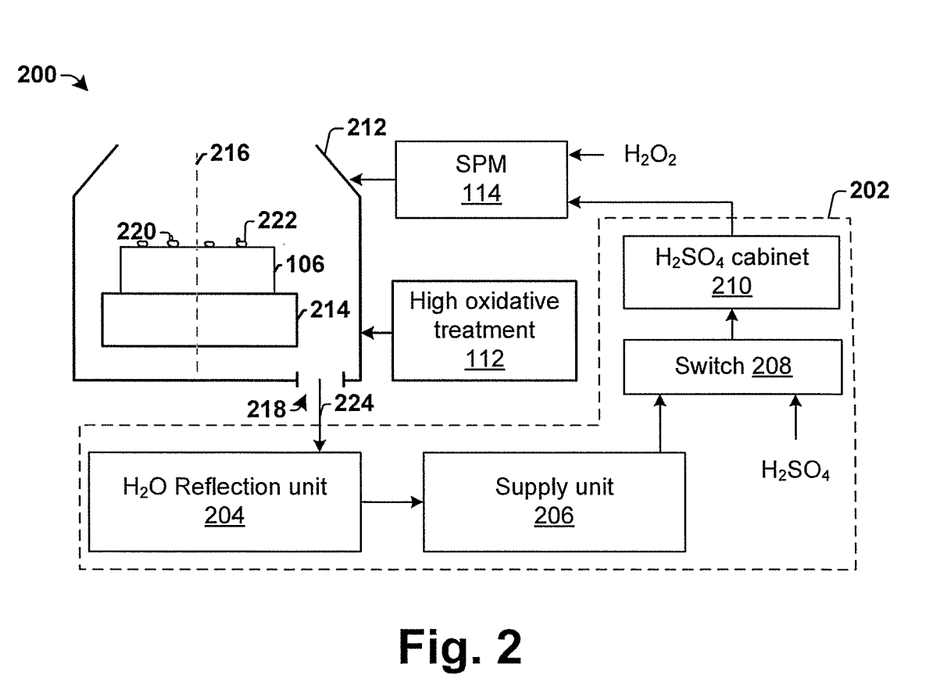
FIG. 2 illustrates a block diagram of a disclosed single wafer cleaning tool that shows more detailed embodiments of an SPM effluent recycling unit.

FIG. 2 illustrates a block diagram of some embodiments of a disclosed single wafer cleaning tool 200 illustrating a more detailed embodiment of a recycling unit 202 configured to recover $H_2SO_4$ from SPM effluent.

The single wafer cleaning tool 200 comprises a processing chamber 212 having a spin base wafer chuck 214 configured to hold a semiconductor substrate 106 (e.g., a substrate made of a semiconductor material (e.g., Si, Ge, GaAs, etc.) and having one or more overlying layers (e.g., an oxide layer, a metal layer, etc.)). The spin base wafer chuck 214 is configured to rotate at a high rate of rotation around an axis of rotation 216 to dry the semiconductor substrate 106 by using a centrifugal force that removes SPM effluent from the semiconductor substrate 106.

During operation, an SPM cleaning unit 114 is configured to provide a SPM cleaning solution to the processing chamber 212. In some embodiments, the SPM cleaning unit 114 is configured mix sulfuric acid ($H_2SO_4$) and hydrogen peroxide ($H_2O_2$) to form an SPM cleaning solution, comprising Caro's acid ($H_2SO_5$) and water ($H_2O$), according to the following reaction:

In some embodiments, the SPM cleaning unit 114 is configured to generate the SPM cleaning solution by mixing $H_2O_2$ and $H_2SO_4$ in a ratio of approximately 1:10.

The SPM cleaning solution is applied to the semiconductor substrate 106 to remove a contaminant remainder having a low concentration of metal impurities 220. Caro's acid ($H_2SO_5$) acts as an active species in the SPM cleaning solution (i.e., piranha etch) that is configured to remove the photoresist residue 222 from the semiconductor substrate 106. For example, in some embodiments, the Caro's acid ($H_2SO_5$) reacts with photoresist residue having carbon, hydrogen and oxygen molecules as shown in the following reaction:

The resulting SPM effluent 224, comprising $H_2O$ and $H_2SO_4$, is evacuated from an outlet 218 in the processing chamber 212 to the recycling unit 202.

The recycling unit 202 comprises a $H_2O$ reflection unit 204 configured to remove $H_2O$ from the SPM effluent 224. In some embodiments, the $H_2O$ reflection unit 204 comprises one or more heating elements configured to raise the temperature of the SPM effluent 224 to a temperature that is sufficient to evaporate $H_2O$ from the SPM effluent 224. Removing $H_2O$ from the SPM effluent 224 results in a recovered $H_2SO_4$ liquid that is provided to a supply unit 206. The supply unit 206 is configured to filter impurities (e.g., photoresist and/or metal impurities) from the $H_2SO_4$ liquid before providing the recovered $H_2SO_4$ to the SPM cleaning unit 114.

In some embodiments, the supply unit 206 may provide $H_2SO_4$ to a switching element 208 configured to selectively provide the recovered $H_2SO_4$ or new $H_2SO_4$ (i.e., $H_2SO_4$ that has not been used in a prior wafer cleaning process) to a $H_2SO_4$ cabinet 210. Since $H_2SO_4$ decays rapidly in a SPM cleaning solution, the $H_2SO_4$ cabinet 210 stores $H_2SO_4$ until a SPM cleaning solution is used by the SPM cleaning unit 114.

Figure 3:
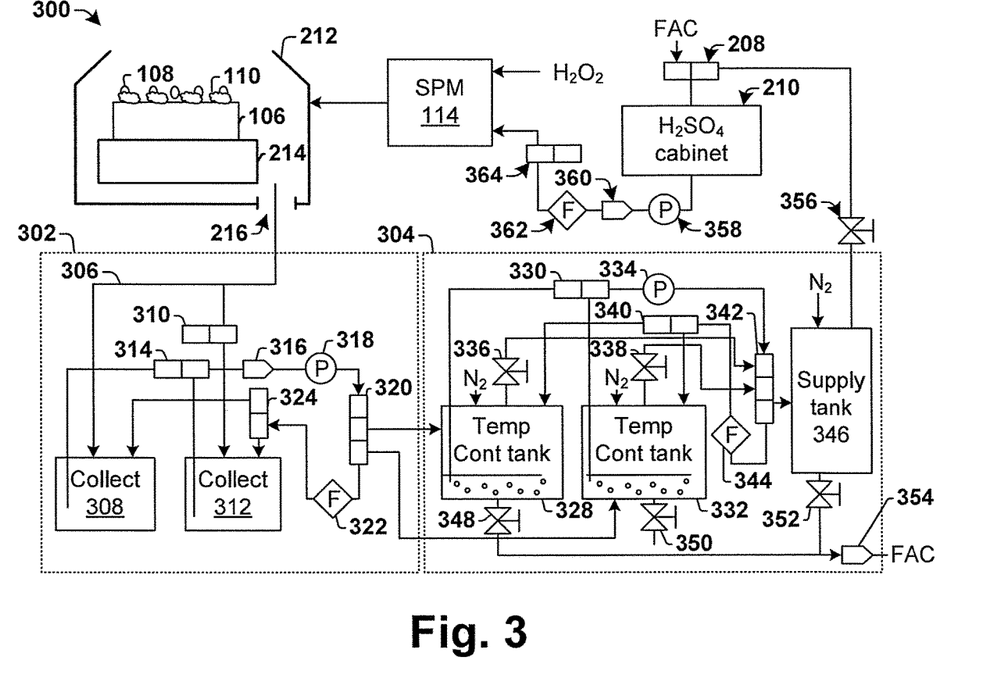
FIG. 3 illustrates a block diagram of some more detailed embodiments of a disclosed single wafer cleaning tool.

FIG. 3 illustrates a block diagram of some more detailed embodiments of a disclosed single wafer cleaning tool 300.

The single wafer cleaning tool 300 comprises a recycling unit configured to remove SPM effluent from a processing chamber 212 by way of a conduit 306. The conduit 306 is connected to a first collection tank 308 comprised within an $H_2O$ reflection unit 302. In some embodiments, the conduit 306 may also be selectively connected to a second collection tank 312 by way of a switching element 310. In some embodiments, the dual first and second collection tanks, 308 and 312, can be used to increase the time that an SPM effluent has for chemical purification. For example, in some embodiments the first and second collection tanks, 308 and 312, can alternatively operate such that when the one collection tank is being operated to recycle SPM effluent, the other collection tank is operated to collected SPM effluent. In some embodiments, the switching element 310 is configured to provide SPM effluent to the first collection tank 308, and when the first collection tank is full, the switching element 310 is configured to provide SPM effluent to the second collection tank 312.

SPM effluent collected in the first and/or second collection tanks, 308 and 312, is provided by way of switching element 314 to a heating element 316. The heating element 316 is configured to remove $H_2O$ from the SPM effluent by raising the temperature of the SPM effluent to a temperature in a range of approximately 100° C. to approximately 150° C. A pump 318 is configured to pump the resulting $H_2SO_4$ to switching element 320. Switching element 320 selectively provides $H_2SO_4$ to a supply unit 304 or to a first filtering element 322 configured to filter residue from the $H_2SO_4$ before switching element 324 provides the $H_2SO_4$ to the first and/or second collection tanks, 308 and 312. By providing the $H_2SO_4$ to the first filtering element 322 and first and/or second collection tanks, 308 and 312, a high degree of $H_2O$ reflection can be achieved through multiple heating cycles.

The supply unit 304 comprises dual first and second temperature control tanks, 328 and 332, configured to receive $H_2SO_4$ from switching element 320. The first and second temperature control tanks, 328 and 332, are configured to heat recycled $H_2SO_4$ so that temperature loss in the downstream $H_2SO_4$ cabinet 210 does not affect process temperature stability. Valves 336 and 338 provide $H_2SO_4$ from a top of the first and/or second temperature control tanks, 328 and 332, by way of switching element 342, to a supply tank 346 or to a second filtering element 344, while pump 334 and switching element 330 provide $H_2SO_4$ (having sediment from the recovered $H_2SO_4$) from a lower part of the first and/or second temperature control tanks, 328 and 332, by way of switching element 342, to a supply tank 346 or to a second filtering element 344. In some embodiments, the second filtering element 344, which is connected in series with the first filtering element 322, further filters the $H_2SO_4$ before providing it back to the first and/or second temperature control tanks, 328 and 332, by way of switching element 340.

In some embodiments, the first and second temperature control tanks, 328 and 332, and the supply tank 346 have valves, 348, 350 and 352, respectively configured to selectively provide the recovered $H_2SO_4$ to a facility system, FAC. In some embodiments, a cooler 354 is configured downstream of the valves, 348 and 350. The cooler 354 is configured to reduce the temperature of the recovered $H_2SO_4$ to protect the facility system, FAC.

The supply tank 346 is configured to output $H_2SO_4$ to valve 356 that is selectively operated to provide $H_2SO_4$ to a switching element 208. The switching element 208 is configured to selectively provide recovered $H_2SO_4$ (from the supply tank 346) or new $H_2SO_4$ (from a facility system) to the $H_2SO_4$ cabinet 210. The $H_2SO_4$ cabinet 210 may provide $H_2SO_4$ to a pump 358, a heater 360, and third filtering element 362. The heater 360 is configured to increase the temperature $H_2SO_4$ mix before it is provided to the processing chamber 212 to perform wafer cleaning with a high temperature cleaning solution. The third filtering element 362 is configured to further filter the recovered $H_2SO_4$ prior to forming the SPM cleaning solution. A switching element 364 is configured to selectively provide $H_2SO_4$ back to $H_2SO_4$ cabinet 210 to maintain a high temperature of $H_2SO_4$.

Figure 4:
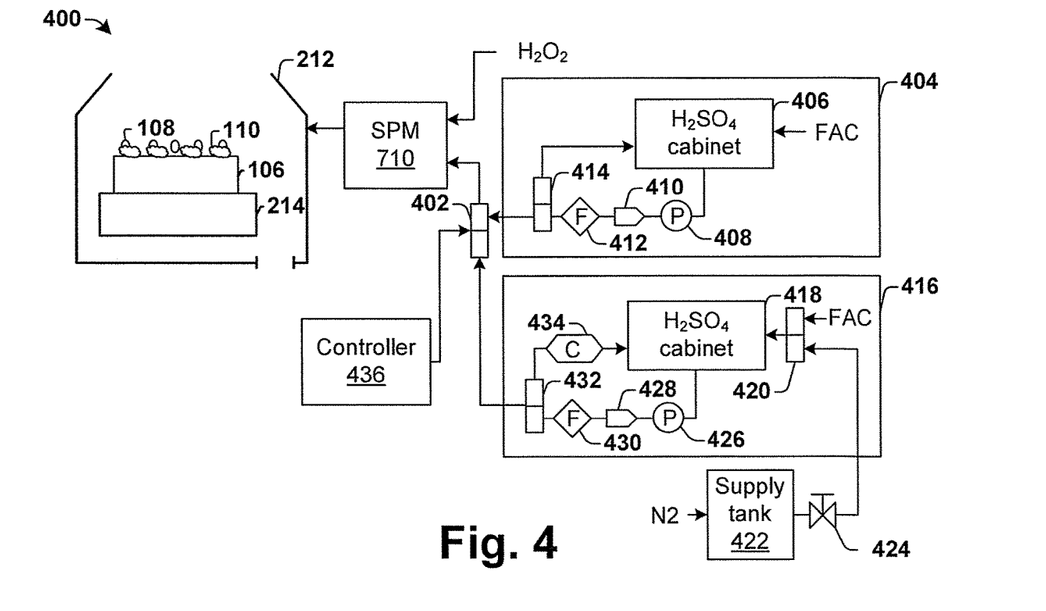
FIG. 4 illustrates a block diagram of some alternative embodiments of a disclosed single wafer cleaning tool.

FIG. 4 illustrates a block diagram of some alternative embodiments of a disclosed single wafer cleaning tool 400 configured to use varying grades of $H_2SO_4$ for critical and non-critical processes.

The single wafer cleaning tool 400 comprises a first $H_2SO_4$ source 404 and a second $H_2SO_4$ source 416. The first and second $H_2SO_4$ sources, 404 and 416, are connected to a switching element 402 configured to selectively provide $H_2SO_4$ to a first inlet of a SPM cleaning unit 114. The first $H_2SO_4$ source 404 is configured to provide a first grade of $H_2SO_4$ to the SPM cleaning unit 114 for critical processes, while the second $H_2SO_4$ source 416 is configured to provide a second grade of $H_2SO_4$, having higher contaminant concentration than the first grade, to the SPM cleaning unit 114 for non-critical processes.

In some embodiments, switching element 402 is operated by a controller 436 configured to monitor processing stages within the processing chamber 212. The controller 436 is configured to selectively operate switching element 402 depending on whether a monitored processing stage is a critical processing stage or a non-critical processing stage. For example, in some embodiments, the controller 436 is configured to operate the switching element 402 to provide new $H_2SO_4$ to the SPM cleaning unit 114 from the first $H_2SO_4$ source 404 for critical processes (e.g., a gate formation process) and to operate the switching element 402 to provide recovered $H_2SO_4$ to the SPM cleaning unit 114 from the second $H_2SO_4$ source 416 for non-critical processes (e.g., a well definition process). By utilizing recovered $H_2SO_4$ to form SPM in non-critical processes, the single wafer cleaning tool 400 can reduce SPM effluent without degrading the quality of SPM in critical processes. It will be appreciated that critical processes and non-critical processes may be defined by a process engineer and may vary depending on a technology, process parameters, design, etc., for example.

In some embodiments, the first $H_2SO_4$ source 404 comprises a first $H_2SO_4$ cabinet 406 configured to receive and to store new $H_2SO_4$ that has not been used in prior SPM cleaning procedures from a facility system, FAC. The first $H_2SO_4$ cabinet 406 is configured to provide $H_2SO_4$ to a pump 408, which pumps the $H_2SO_4$ to a heating element 410 and to a filtering element 412. Switching element 414 selectively provides the new $H_2SO_4$ to switching element 402 or to the first $H_2SO_4$ cabinet 406 depending on the state of switching element 402. By operating switching element 414 to provide $H_2SO_4$ back to the first $H_2SO_4$ cabinet 406, the new $H_2SO_4$ provided to switching element 402 can maintain a high temperature.

In some embodiments, the second $H_2SO_4$ source 416 comprises a second $H_2SO_4$ cabinet 418. The second $H_2SO_4$ cabinet 418 is connected to a switching element 420 configured to selectively provide a new $H_2SO_4$ from a facility system, FAC, or recovered $H_2SO_4$, from a valve 424 connected to a supply tank 422, to the second $H_2SO_4$ cabinet 418. The second $H_2SO_4$ cabinet 418 is configured to store $H_2SO_4$ that has been used in prior SPM cleaning procedures. The second $H_2SO_4$ cabinet 418 is configured to provide $H_2SO_4$ to a pump 426, which pumps the $H_2SO_4$ to a heating element 428 and to a filtering element 430. Switching element 432 selectively provides $H_2SO_4$ to switching element 402 or to the second $H_2SO_4$ cabinet 418 by way of a cooling element 434.

Figure 5:
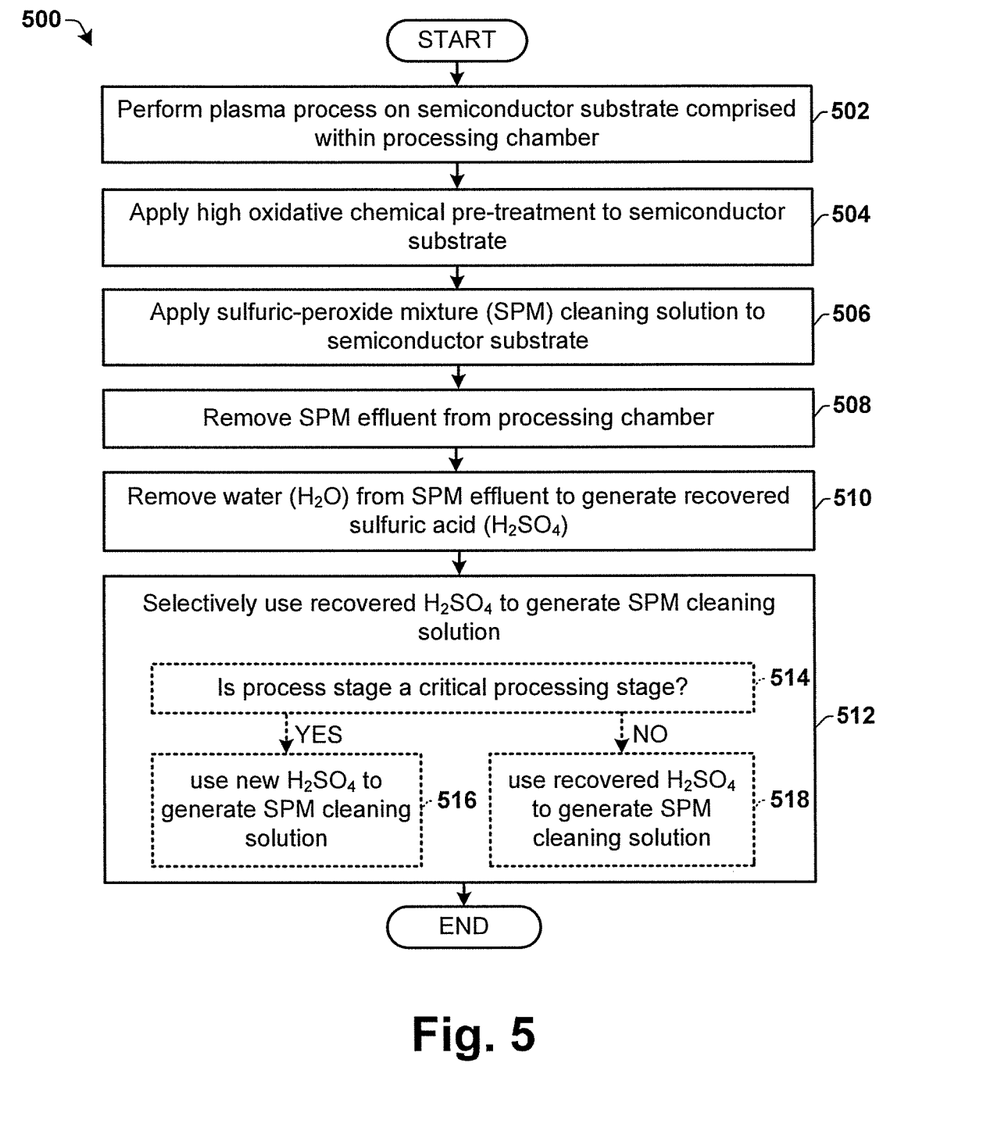
FIG. 5 is a flow diagram illustrating some embodiments of a disclosed method of performing a single wafer cleaning process.

FIG. 5 is a flow diagram illustrating some embodiments of a disclosed method 500 of performing a single wafer cleaning process.

It will be appreciated that while the disclosed method 500 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At act 502, a plasma process is performed on a semiconductor substrate comprised within a processing chamber. In some embodiments, the plasma process may comprise a photoresist ashing process that removes photoresist from the surface of a semiconductor substrate. The photoresist ashing process leaves photoresist residue having metal impurities on the surface of the semiconductor substrate.

At act 504, a high oxidative chemical pre-treatment is performed on the semiconductor substrate. In some embodiments, the high oxidative chemical pretreatment comprises ozone ($O_3$). The high oxidative chemical pre-treatment removes the photoresist residue and metal impurities from the semiconductor substrate to form a contaminant remainder having a low concentration of metal impurities.

At act 506, a sulfuric-peroxide mixture (SPM) cleaning solution is applied to the semiconductor substrate. The SPM cleaning solution removes the contaminant remainder from the semiconductor substrate. In some embodiments, the SPM cleaning solution removes photoresist from the semiconductor substrate by breaking down the carbon polymer chain resulting in a SPM effluent comprising water ($H_2O$) and carbon dioxide ($CO_2$) by-products along with sulfuric acid ($H_2SO_4$).

At act 508, the SPM effluent is removed from the processing chamber.

At act 510, water ($H_2O$) is removed from the SPM effluent, resulting in a recovered sulfuric acid ($H_2SO_4$) solution. In some embodiments, $H_2O$ is removed from the SPM effluent by heating the SPM effluent to a temperature sufficient to evaporate $H_2O$ from the SPM effluent (e.g., heating the SPM effluent to a temperature in a range of approximately 100° C. to 150° C.).

At act 512, the recovered $H_2SO_4$ solution is selectively mixed with hydrogen peroxide ($H_2O_2$) to generate a SPM cleaning solution. The SPM cleaning solution generated from the recovered $H_2SO_4$ solution may be subsequently applied to a semiconductor substrate (e.g., as done in act 506).

In some embodiments, the recovered $H_2SO_4$ solution may be selectively used to form a SPM cleaning solution based upon a single cleaning wafer processing stage. For example, in some embodiments method 500 determines if a processing stage is a critical processing stage (i.e., a processing stage having a low threshold for contaminants), at act 514. If the processing stage is a critical processing stage, new $H_2SO_4$ (i.e., $H_2SO_4$ that has not been used in a prior single stage cleaning process) is mixed with hydrogen peroxide ($H_2O_2$) to generate a SPM cleaning solution, at act 516. If the processing stage is not a critical processing stage, the recovered $H_2SO_4$ is mixed with hydrogen peroxide ($H_2O_2$) to generate a SPM cleaning solution, at act 518.

Figure 6:
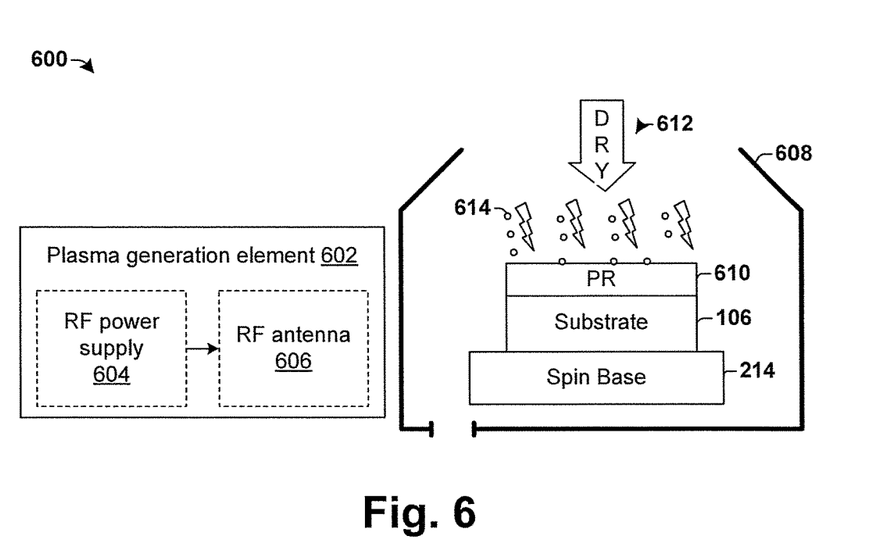
FIGS. 6-8 illustrate cross-sectional views of some embodiments of an exemplary single wafer cleaning tool, whereon method of FIG. 5 is implemented.
Figure 7:
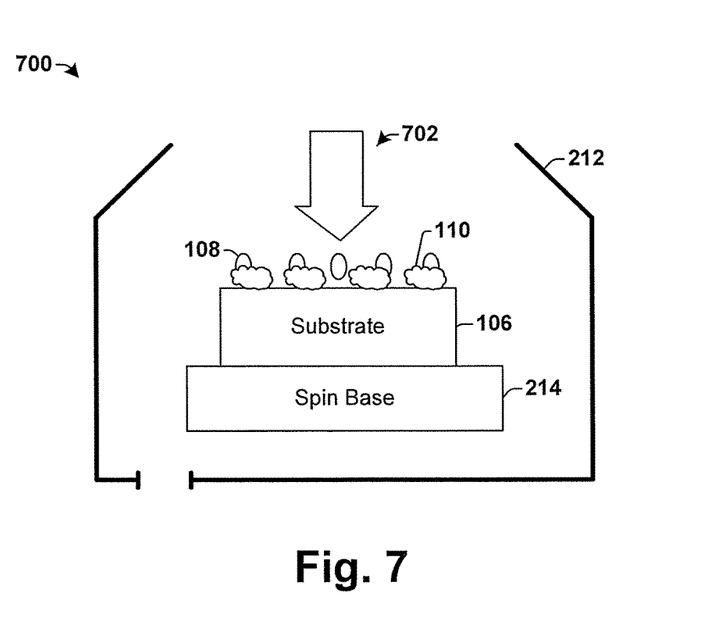
Figure 8:
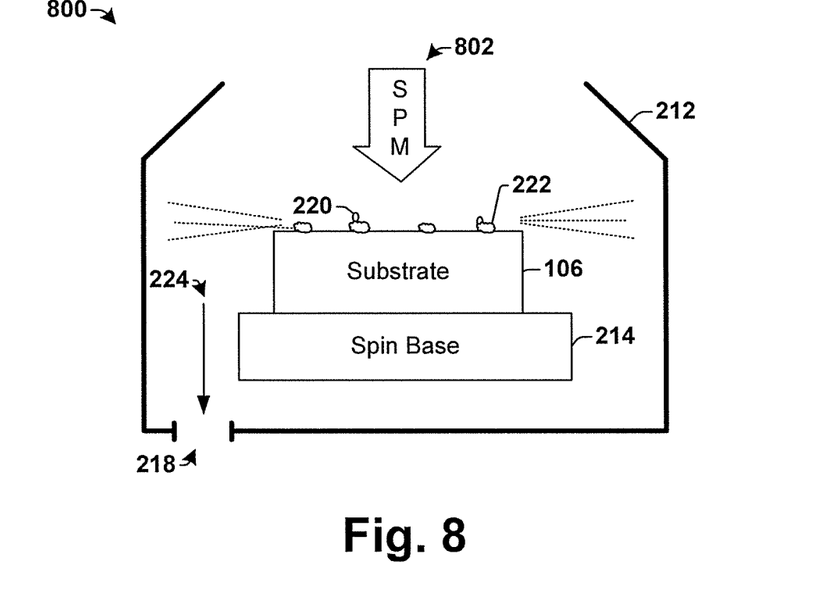

FIGS. 6-8 illustrate cross-sectional views of some embodiments of an exemplary single wafer cleaning tool, whereon method 500 is implemented. Although FIGS. 6-8 are described in relation to a method, it will be appreciated that the structures disclosed in FIGS. 6-8 are not limited to such a method. Rather, it will be appreciated that the illustrated structures of FIGS. 6-8 provide for a structural description of a disclosed single wafer cleaning tool that is able to stand alone independent of a method of formation.

FIG. 6 illustrates a cross-sectional view 600 corresponding to act 502. As shown in cross sectional view 600, a plasma generation element 602 is in communication with a processing chamber 608. The plasma generation element 602 is configured to perform a plasma process by generating a plasma within the processing chamber 608 that operates upon the semiconductor substrate 106. In various embodiments, the plasma process may comprise a plasma ashing process, a plasma etching process, or some other plasma process. For example, in some embodiments, the plasma process may comprise an ashing process configured to generate a dry etchant 612 that removes an overlying photoresist layer 610 from a semiconductor substrate 106 located within the processing chamber 608. The dry etchant acts as a source of metal impurities 614 that remain on the semiconductor substrate 106 after the ashing process has been completed.

In some embodiments, the plasma generation element 602 may comprise a RF plasma generation element having an RF power supply 604 and an RF antenna 606. The RF power supply 604 is configured to generate an RF signal operating at a set frequency (e.g., 13.56 MHz), which transfers energy from the RF power supply 604, via the RF antenna 606, to a gas within the processing chamber 212. When sufficient power has been delivered to the gas, a plasma is ignited. In some embodiments, the RF antenna 606 may comprise a conductive coil, formed from a conductive wire, which extends from the RF power supply 604 to a position operatively coupled to processing chamber 212 (e.g., wrapped around an exterior of the processing chamber 212 for a plurality of turns)

FIG. 7 illustrates a cross-sectional view 700 corresponding to act 504. The cross-sectional 700 illustrates a processing chamber 212 comprising a semiconductor substrate 106 may comprises a photoresist residue 110 having metal impurities 108. A high oxidative chemical pre-treatment 702 (e.g., ozone) is applied to a surface of the semiconductor substrate comprising the photoresist residue 110 and metal impurities 108. The high-oxidative chemical pre-treatment 702 is configured to remove the the photoresist residue 110 and metal impurities, resulting in a contaminant remainder having a reduced concentration of metal impurities.

FIG. 8 illustrates a cross-sectional view 800 corresponding to acts 506-508. The cross-sectional 500 illustrates a processing chamber 212 comprising a semiconductor substrate 106 having a contaminant remainder comprising reduced metal impurities 220 and photoresist residue 222. A SPM cleaning solution 802 is applied to a surface of the semiconductor substrate 106 comprising the contaminant remainder. The SPM cleaning solution 802 removes the contaminant remainder from the surface of the semiconductor substrate 106 as SPM effluent 224 that is evacuated from the processing chamber 212 by way of an outlet 218. Since the high oxidative chemical pre-treatment removed a large portion of the metal impurities from the semiconductor substrate 106, the SPM effluent 224 has a low concentration of photoresist and metal and is able to be recycled.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to methods and apparatus for mitigating high metal concentrations in photoresist residue and recycling sulfuric acid ($H_2SO_4$) in single wafer cleaning tools.

In some embodiments, the present disclosure relates to a single wafer cleaning tool. The single wafer cleaning tool comprises a processing chamber configured to house a semiconductor substrate having a photoresist residue having metal impurities. The single wafer cleaning tool further comprises a high oxidative treatment unit in communication with the processing chamber and configured to apply a high oxidative chemical pre-treatment to the semiconductor substrate to reflect the photoresist residue having metal impurities in a manner that results in a contaminant remainder. The single wafer cleaning tool further comprises a SPM cleaning unit in communication with the processing chamber and configured to apply a sulfuric-peroxide mixture (SPM) cleaning solution to the semiconductor substrate to remove the contaminant remainder from the semiconductor substrate as an SPM effluent. The single wafer cleaning tool further comprises a recycling unit configured to recover sulfuric acid ($H_2SO_4$) from the SPM effluent and to provide the recovered $H_2SO_4$ to the SPM cleaning unit via a feedback conduit.

In another embodiment, the present disclosure relates to a single wafer cleaning tool, comprising a processing chamber configured to house a semiconductor substrate having a photoresist residue having metal impurities. A high oxidative treatment unit is configured to apply a high oxidative chemical pre-treatment to the semiconductor substrate to reduce the photoresist residue and the metal impurities in a manner that results in a contaminant remainder. A SPM cleaning unit is configured to apply a sulfuric-peroxide mixture (SPM) cleaning solution to the semiconductor substrate to remove the contaminant remainder from the semiconductor substrate as an SPM effluent comprising water ($H_2O$) and sulfuric acid ($H_2SO_4$). A recycling unit is configured to heat the SPM effluent to vaporize the $H_2O$ and generate recovered sulfuric acid ($H_2SO_4$), which is provided to the SPM cleaning unit via a feedback conduit.

In another embodiment, the present disclosure relates to a method for performing a single wafer cleaning procedure. The method comprises applying a high oxidative chemical pre-treatment to semiconductor substrate having a photoresist residue with metal impurities in a manner that results in a contaminant remainder. The method further comprises applying a sulfuric-peroxide mixture (SPM) cleaning solution to semiconductor substrate to remove the contaminant remainder from the semiconductor substrate as an SPM effluent comprising water ($H_2O$) and sulfuric acid ($H_2SO_4$). The method further comprises removing water ($H_2O$) from SPM effluent to generate recovered sulfuric acid ($H_2SO_4$).

What is claimed is:

1. A single wafer cleaning tool, comprising:
    a processing chamber configured to house a semiconductor substrate having a photoresist residue having metal impurities;
    an oxidative treatment unit in communication with the processing chamber by way of a first inlet and configured to apply an oxidative chemical pre-treatment to the semiconductor substrate to remove a part of the photoresist residue having metal impurities in a manner that results in a contaminant remainder;
    a SPM cleaning unit in communication with the processing chamber by way of a second inlet configured to apply a sulfuric-peroxide mixture (SPM) cleaning solution to the semiconductor substrate separate from the oxidative chemical pre-treatment to remove the contaminant remainder from the semiconductor substrate as an SPM effluent; and
    a recycling unit coupled to the processing chamber and configured to recover sulfuric acid ($H_2SO_4$) from the SPM effluent and to provide the recovered $H_2SO_4$ to the SPM cleaning unit via a feedback conduit, wherein the recycling unit comprises:
        first and second collection tanks;
        a first switching element having inputs directly coupled by first and second conduits to outputs of the first and second collection tanks, respectively;
        a heating element having an input that is coupled to an output of the first switching element by a first fluid path;
        a second switching element having an input that is coupled to an output of the heating element by a second fluid path;
        a feedback path extending between a first output of the second switching element and an input of a third switching element, wherein the third switching element has a first output coupled to the first collection tank and a second output coupled to the second collection tank; and
        wherein the feedback path further comprises a filter.

2. The single wafer cleaning tool of claim 1, wherein the oxidative chemical pre-treatment comprises ozone ($O_3$).

3. The single wafer cleaning tool of claim 1, wherein the recycling unit comprises:
    a supply unit, configured to receive the recovered $H_2SO_4$ and to filter contaminant particles from the recovered $H_2SO_4$.

4. The single wafer cleaning tool of claim 1, further comprising:
    first and second temperature control tanks having inputs respectively coupled to second and third outputs of the second switching element;
    a fourth switching element coupled between the first and second temperature control tanks and an input of a supply tank;
    a valve coupled to an output of the supply tank;
    a fifth switching element coupled to the valve; and
    a first $H_2SO_4$ cabinet connected between the fifth switching element and the SPM cleaning unit, wherein the first $H_2SO_4$ cabinet is configured to store the recovered $H_2SO_4$.

5. The single wafer cleaning tool of claim 1, wherein the SPM cleaning unit is configured to generate the SPM cleaning solution by mixing $H_2O_2$ and $H_2SO_4$ in a ratio of 1:10.

6. The single wafer cleaning tool of claim 1,
    wherein the first collection tank and the second collection tank are configured to be alternatively operated such that when the first collection tank is operated to recycle SPM effluent the second collection tank is operated to collect SPM effluent.

7. The single wafer cleaning tool of claim 1, wherein the recycling unit comprises two or more filters connected in series and configured to remove residue from the recovered $H_2SO_4$.

8. The single wafer cleaning tool of claim 1, wherein the feedback path comprises:
    a third conduit directly coupling the second switching element and the filter; and
    a fourth conduit directly coupling the filter to the input of the third switching element.

9. The single wafer cleaning tool of claim 1, further comprising:
   a first temperature control tank directly coupled by way of a third conduit to a second output of the second switching element;
   a second temperature control tank directly coupled by way of a fourth conduit to a third output of the second switching element; and
   a fifth conduit of the feedback path directly coupling the first output of the second switching element to an input of the filter.

10. A single wafer cleaning tool, comprising:
   a processing chamber configured to house a semiconductor substrate having a photoresist residue having metal impurities;
   an oxidative treatment unit in communication with the processing chamber by way of a first inlet and configured to apply an oxidative chemical pre-treatment to the semiconductor substrate to remove a part of the photoresist residue having metal impurities in a manner that results in a contaminant remainder;
   a SPM cleaning unit in communication with the processing chamber by way of a second inlet configured to apply a sulfuric-peroxide mixture (SPM) cleaning solution to the semiconductor substrate separate from the oxidative chemical pre-treatment to remove the contaminant remainder from the semiconductor substrate as an SPM effluent; and
   a recycling unit coupled to the processing chamber and configured to recover sulfuric acid ($H_2SO_4$) from the SPM effluent and to provide the recovered $H_2SO_4$ to the SPM cleaning unit via a feedback conduit, wherein the recycling unit comprises:
      first and second collection tanks;
      a first switching element having inputs directly coupled by first and second conduits to outputs of the first and second collection tanks, respectively;
      a heating element having an input that is directly coupled to an output of the first switching element by a first fluid path;
      a second switching element having an input that is coupled to an output of the heating element by a second fluid path;
      a feedback path extending between a first output of the second switching element and an input of a third switching element, wherein the third switching element has a first output directly coupled to a first input of the first collection tank by way of a third fluid path and a second output directly coupled to a first input of the second collection tank by way of a fourth fluid path;
      wherein the feedback path further comprises a filter; and
      a fifth fluid path coupling the processing chamber to a second input of the first collection tank.

11. The single wafer cleaning tool of claim 10, wherein the recycling unit further comprises:
   a fourth switching element having an input coupled to an output of the processing chamber and an output directly coupled by way of a sixth fluid path to a second input of the second collection tank.

12. The single wafer cleaning tool of claim 10, wherein the feedback path further comprises:
   a third conduit directly coupling the first output of the second switching element to an input of the filter; and
   a fourth conduit directly coupling an output of the filter to the input of the third switching element.

13. The single wafer cleaning tool of claim 10, wherein the recycling unit further comprises:
   a first temperature control tank directly coupled by way of a third conduit to a second output of the second switching element; and
   a second temperature control tank directly coupled by way of a fourth conduit to a third output of the second switching element.

14. A single wafer cleaning tool, comprising:
   a processing chamber configured to house a semiconductor substrate having a photoresist residue having metal impurities;
   an oxidative treatment unit in communication with the processing chamber by way of a first inlet and configured to apply an oxidative chemical pre-treatment to the semiconductor substrate to remove a part of the photoresist residue having metal impurities in a manner that results in a contaminant remainder;
   a SPM cleaning unit in communication with the processing chamber by way of a second inlet configured to apply a sulfuric-peroxide mixture (SPM) cleaning solution to the semiconductor substrate separate from the oxidative chemical pre-treatment to remove the contaminant remainder from the semiconductor substrate as an SPM effluent; and
   a recycling unit coupled to the processing chamber and configured to recover sulfuric acid ($H_2SO_4$) from the SPM effluent and to provide the recovered $H_2SO_4$ to the SPM cleaning unit via a feedback conduit, wherein the recycling unit comprises:
      first and second collection tanks;
      a first switching element having inputs directly coupled by first and second conduits to outputs of the first and second collection tanks, respectively;
      a heating element having an input that is coupled to an output of the first switching element by a first fluid path;
      a second switching element having an input that is coupled to an output of the heating element by a second fluid path;
      a feedback path extending between a first output of the second switching element and an input of a third switching element, wherein the third switching element has a first output coupled to the first collection tank and a second output coupled to the second collection tank;
      wherein the feedback path comprises:
         a filter;
         a third conduit directly coupling the first output of the second switching element to an input of the filter; and
         a fourth conduit directly coupling an output of the filter to the input of the third switching element.

15. The single wafer cleaning tool of claim 14, wherein the recycling unit further comprises:
   a fourth switching element having an input coupled to the processing chamber and further having an output directly coupled by way of a fifth conduit to a first input of the second collection tank.

16. The single wafer cleaning tool of claim 14, wherein the recycling unit further comprises:
   a pump having an input directly coupled to the output of the heating element by way of a fifth conduit and further having an output directly coupled to the input of the second switching element by way of the second fluid path.

17. The single wafer cleaning tool of claim 14, wherein the second switching element further comprises a second output and a third output.

18. The single wafer cleaning tool of claim 14, wherein the recycling unit further comprises:
   a first temperature control tank directly coupled by way of a fifth conduit to a second output of the second switching element; and
   a second temperature control tank directly coupled by way of a sixth conduit to a third output of the second switching element.

19. The single wafer cleaning tool of claim 18, wherein the recycling unit further comprises:
   a fourth switching element having inputs directly coupled by seventh and eigth conduits to outputs of the first and second temperature control tanks, respectively;
   a fifth switching element having an input that is coupled to an output of the fourth switching element by a third fluid path;
   a second feedback path extending between a first output of the fifth switching element and an input of a sixth switching element, wherein the sixth switching element has a first output directly coupled to the first temperature control tank by way of a fourth fluid path and a second output directly coupled to the second temperature control tank by way of a fifth fluid path; and
   a supply tank directly coupled to a second output of the fifth switching element by way of a sixth fluid path.

20. The single wafer cleaning tool of claim 19, wherein the second feedback path further comprises:
   a seventh fluid path directly coupling the first output of the fifth switching element to an input of a second filter; and
   a eighth fluid path directly coupling an output of the second filter to the input of the sixth switching element.

* * * * *

UNITED STATES PATENT AND TRADEMARK OFFICE
CERTIFICATE OF CORRECTION

PATENT NO. : 10,510,527 B2  
APPLICATION NO. : 13/756717  
DATED : December 17, 2019  
INVENTOR(S) : Chien-Wen Hsiao et al.

Page 1 of 1

It is certified that error appears in the above-identified patent and that said Letters Patent is hereby corrected as shown below:

In the Claims

Column 13, Line 14, Claim 19: Replace "eigth" to correctly read ---eighth---

Signed and Sealed this  
Twenty-eighth Day of January, 2020

Andrei Iancu  
*Director of the United States Patent and Trademark Office*